(12) United States Patent
Reboh et al.

(10) Patent No.: US 11,810,789 B2
(45) Date of Patent: Nov. 7, 2023

(54) METHOD OF FABRICATING A SEMICONDUCTOR SUBSTRATE HAVING A STRESSED SEMICONDUCTOR REGION

(71) Applicant: Commissariat A L'Energie Atomique et aux Energies Alternatives, Paris (FR)

(72) Inventors: Shay Reboh, Grenoble (FR); Victor Boureau, Grenoble (FR); Sylvain Maitrejean, Grenoble (FR); Francois Andrieu, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 16/709,993

(22) Filed: Dec. 11, 2019

(65) Prior Publication Data

US 2020/0194273 A1 Jun. 18, 2020

(30) Foreign Application Priority Data

Dec. 12, 2018 (FR) ..................................... 18 72765

(51) Int. Cl.
*H01L 21/308* (2006.01)
*H01L 21/02* (2006.01)
*H01L 21/8234* (2006.01)

(52) U.S. Cl.
CPC ...... *H01L 21/3083* (2013.01); *H01L 21/0245* (2013.01); *H01L 21/02249* (2013.01); *H01L 21/3081* (2013.01); *H01L 21/8234* (2013.01)

(58) Field of Classification Search
CPC .......................... H01L 21/308; H01L 21/30604
See application file for complete search history.

(56) References Cited

U.S. PATENT DOCUMENTS

| 10,263,110 B2 | 4/2019 | Berthelon et al. |
| 2016/0197147 A1* | 7/2016 | Balakrishnan .......... H01L 21/18 257/347 |

(Continued)

FOREIGN PATENT DOCUMENTS

FR 3 046 492 A1 7/2017

OTHER PUBLICATIONS

S. Wolf and R.N. Tauber, "Silicon Processing for the VLSI Era, vol. 1—Process Technology", Lattice Press, California, 1986, pp. 521-535.*

(Continued)

*Primary Examiner* — Thomas T Pham
(74) *Attorney, Agent, or Firm* — Oblon, McClelland, Maier & Neustadt, L.L.P.

(57) ABSTRACT

A method for producing a semiconductor substrate is provided, including: producing a superficial layer arranged on a buried dielectric layer and including a strained semiconductor region; producing an etching mask on the superficial layer, covering a part of the region; etching the superficial layer to a pattern of the mask, exposing a first lateral edge of a first strained semiconductor portion belonging to the part and contacting the dielectric layer; forming a mechanical barrier from a second portion of material belonging to the first portion, the second portion having a bottom surface contacting the dielectric layer and an upper surface contacting the mask, the barrier arranged against the part and bearing mechanically against the second portion, and removing the mask.

20 Claims, 7 Drawing Sheets

(56) References Cited

U.S. PATENT DOCUMENTS

| | | | | |
|---|---|---|---|---|
| 2016/0359045 A1* | 12/2016 | Balakrishnan | ...... | H01L 29/6653 |
| 2016/0372551 A1* | 12/2016 | Doris | ................ | H01L 29/1054 |
| 2017/0077231 A1* | 3/2017 | Balakrishnan | ...... | H01L 29/7842 |
| 2017/0194498 A1 | 7/2017 | Berthelon et al. | | |
| 2020/0006055 A1* | 1/2020 | Chen | ................ | H01L 21/76856 |

OTHER PUBLICATIONS

Wolf et al., "Silicon Processing for the VLSI Era, vol. 1—Process Technology", Lattice Press, California, 1986, pp. 521-535.*
U.S. Appl. No. 16/221,939, filed Dec. 17, 2018, US 2019-0198397 A1, Andrieu, F., et al.
U.S. Appl. No. 16/5257043, filed Jul. 29, 2019, US 2020-0035561 A1, Andrieu, F., et al.
U.S. Appl. No. 16/535,567, filed Jul. 26, 2019, US 2020-0058768 A1, Reboh, S., et al.
U.S. Appl. No. 16/580,396, filed Sep. 24, 2019, US 2020-0098859 A1, Reboh, S., et al.
U.S. Appl. No. 16/671,352, filed Nov. 1, 2019, Maitrejean, S., et al.
U.S. Appl. No. 16/590,557, filed Oct. 2, 2019, US 2020-0111872 A1, Reboh, S., et al.
U.S. Appl. No. 16/716,659, filed Dec. 17, 2019, US 2020-0203229 A1, Andrieu, F., et al.
U.S. Appl. No. 16/732,950, filed Jan. 2, 2020, Maitrejean, S., et al.
U.S. Appl. No. 16/733,006, filed Jan. 2, 2020, Reboh, S., et al.
U.S. Appl. No. 16/812,530, filed Mar. 9, 2020, US 2020-0212179 A1, Reboh, S., et al.
U.S. Appl. No. 16/914,541, filed Jun. 29, 2020, US 2021-0005443 A1, Reboh S., et al.
U.S. Appl. No. 16/993,894, filed Aug. 18, 2020, US 2021-0057267 A1, Reboh, S., et al.
U.S. Appl. No. 17/040,138, filed Mar. 26, 2019, US 2021-0028231 A1, Andrieu, F., et al.
U.S. Appl. No. 17/103,219, filed Nov. 24, 2020, Reboh, S., et al.
U.S. Appl. No. 17/124,184, filed Dec. 16, 2020, Reboh, S., et al.
Irisawa, T., et al., "High-Performance Uniaxially Strained SiGe-on-Insulator pMOSFETs Fabricated by Lateral-Strain-Relaxation Technique", IEEE Transactions on Electron Devices, IEEE Service Center, vol. 53, n°11, Nov. 1, 2006, pp. 2809-2815 (D2).
Vincent, B., et al., "The Ge condensation technique: A solution for planar SOI/GeOI co-integration for advanced CMOS technologies?", Material Science in Semiconductor Processing, vol. 11, (2008) pp. 205-213.
Nayak, D.K., et al., "Wet oxidation of GeSi strained layers by rapid thermal processing", Appl. Phys. Lett., vol. 57, No. 4, Jul. 23, 1990, pp. 369-371 with cover page.
Morin, P., et al., "A comparison of the mechanical stability of silicon nitride films deposited with various techniques", Applied Surface Science, vol. 260, Nov. 1, 2012, pp. 69-72.

* cited by examiner

METHOD OF FABRICATING A SEMICONDUCTOR SUBSTRATE HAVING A STRESSED SEMICONDUCTOR REGION

TECHNICAL FIELD AND PRIOR ART

The invention relates to the field of semiconductor substrates suited to the production of semiconductor devices such as transistors, and including at least one region of compressively or tensile strained semiconductor suited to the production of active zones of semiconductor devices. Such a substrate advantageously enables the production, in the strained semiconductor region, of P-type FETs (Field Effect Transistors) when the semiconductor is compressively strained, or N-type FETs when the semiconductor is tensile strained. Such a substrate further enables the integration, on a same semiconducting layer, of FETs of different types and/or of which the channels are formed in semiconductor regions subjected to different strains, for example P-type FETs having compressively strained channels and other FETs, for example of N-type and having non-compressively strained or tensile strained channels, or instead other P-type transistors having compressively strained or non-compressively strained channels.

A mechanically deformed crystalline material corresponds to a material that has its crystalline lattice parameter(s) lengthened or shortened. In the case where the deformed lattice parameter is greater than the so-called "natural" parameter of the crystalline material, this is termed tensile deformation. When the deformed lattice parameter is smaller than the natural lattice parameter, the material is designated as being in compressive deformation or in compression.

The mechanical deformation states of a crystalline material are associated with mechanical strain states. For all that, it is also common to refer to these deformation states as mechanical strain states. In the present application, this notion of deformation is designated in a generic manner by the term "strained".

In order to improve the performances of a transistor, said transistor may be produced with a strained channel, that is to say of which the semiconductor forming the channel comprises a strain, or is subjected to a strain.

In a P-type FET, a compressive strain, or compression strain, of the channel makes it possible to improve the mobility of the charge carriers (holes) in the channel. In an N-type FET, it is a tensile strain of the channel that makes it possible to improve the mobility of the charge carriers (electrons) in the channel.

To produce a P-type FET with a compressively strained channel, it is possible to use a substrate including an active layer (layer in which the active zone of the transistor is produced) of compressively strained SiGe. An exemplary embodiment of such a substrate 10 is described in relation with FIGS. 1 to 5.

The substrate 10 is produced from a semiconductor on insulator type substrate, here SOI. The SOI substrate comprises a support layer 12, or thick layer, on which is located a buried dielectric layer 14, or BOX (Buried Oxide), including for example $SiO_2$ and of which the thickness is for example between around 25 nm and 200 nm, and a superficial layer 16, or thin layer, of which the thickness is for example between around 5 nm and 30 nm, here including silicon and in which the active zones of the FET are intended to be produced.

A SiGe layer 18 is firstly formed by epitaxy on the part(s) of the superficial layer 16 in which compressively strained SiGe is intended to be produced, for example in the region(s) of the superficial layer 16 in which P-type FETs are intended to be produced (FIG. 1). This localisation of the layer 18 on the desired part(s) of the superficial layer 16 may be obtained using a mask, including for example SiN, of which the opening(s) are located above this or these parts of the superficial layer 16. In FIG. 1, the SiGe layer 18 covers the entire superficial layer 16.

A step of thermal oxidation of the SiGe layer 18 is next implemented. This oxidation, which is implemented at a high temperature, for example above 850° C., leads to a migration of germanium atoms coming from the layer 18 into the silicon of the superficial layer 16. The germanium concentration in the layer 16 is homogenised. The buried dielectric layer 14 forms a diffusion barrier during this oxidation. This germanium enrichment of the silicon of the layer 16 modifies the nature of the silicon of the layer 16 which becomes compressively strained SiGe. In FIG. 2, the structure which is shown corresponds to the structure obtained at the end of this oxidation step, in which the layer 18 mainly comprises $SiO_2$ and the layer 16 comprises compressively strained SiGe.

The oxide layer 18 formed by the oxidation of SiGe is next removed (FIG. 3). The stack of remaining layers 12, 14 and 16 together form a substrate 10 of SiGeOI, or SGOI (that is to say SiGe on insulator) type, with compressively strained SiGe forming the superficial layer of this substrate 10.

This technique of producing compressively strained SiGe, called Ge condensation or Ge enrichment, is for example described in the document "The Ge condensation technique: A solution for planar SOI/GeOI co-integration for advanced CMOS technologies?" of B. Vincent et al., Material Science in Semiconductor Processing 11 (2008), pages 205-213.

From such a substrate 10, different technological steps are next implemented. The production of STI (Shallow Trench Isolation) isolation trenches within the substrate 10 involves etching the layer 16 to form distinct, or isolated, regions of SiGe. Thus, in FIG. 4, an etching mask 20 is deposited on the layer 16, then this layer 16 is etched in accordance with the pattern of the mask 20. This etching may be extended through the buried dielectric layer 14 and also in the support layer 12 (as is the case in the method described here). An isolation trench 22 is formed by depositing a dielectric material in the etched trench, then the mask 20 is removed (FIG. 5). The substrate 10 including different regions isolated from each other by isolation trenches 22 is thereby obtained.

A problem encountered with the method described above is that after having produced the isolation trench or trenches 22 and after having removed the mask 20, a more important reduction in the compressive strain than that due to only the elastic relaxation of the semiconductor takes place in the compressively strained semiconductor. The beneficial effects linked to this strain and obtained in transistors produced in such a substrate are thus reduced.

The document FR 3 046 492 proposes a method wherein the isolation trenches are replaced by bars of oxide formed by oxidation of portions of the semiconductor of the active layer. By avoiding etching the superficial layer, the important reduction in the strain described previously does not take place. However, such a method is not suited to the production of isolation trenches that have to reach a certain depth in the substrate, such as for example when the isolation trenches are used to isolate wells between each other in order to enable a biasing of the wells independently of each other.

DESCRIPTION OF THE INVENTION

Thus there is a need to propose a method for producing a semiconductor substrate suited to the production of semiconductor devices, notably FETs, in at least one strained semiconductor region, wherein excessive relaxation of the strained semiconductor is avoided during etching of the strained semiconductor, and this is so even when this etching is implemented through the active layer including the strained semiconductor and at least one part of one or several layers arranged under the active layer.

To do so, it is proposed a method for producing a semiconductor substrate, including at least the implementation of the following steps:
- producing a superficial layer arranged on a buried dielectric layer and including at least one strained semiconductor region;
- producing an etching mask on the superficial layer, covering at least one part of the strained semiconductor region;
- etching the superficial layer according to a pattern of the etching mask, exposing at least one first lateral edge formed by at least one first strained semiconductor portion belonging to said part of the strained semiconductor region and which is in contact with the buried dielectric layer;
- modifying the first strained semiconductor portion into at least one second portion of material forming a mechanical support element arranged against the strained semiconductor region;
- removing the etching mask.

In this method, between the step of etching the superficial layer and the step of removing the etching mask, a step of modifying at least one first portion of the strained semiconductor that forms the first lateral edge(s) exposed by the etching and which is in contact with the buried dielectric layer is implemented to replace or transform the strained semiconductor of this or these first portions into at least one second portion of material(s) different or not from the strained semiconductor. The material forming the first lateral edge(s) and which forms part of the buried dielectric layer/superficial layer interface is thus modified.

The modification of the strained semiconductor of the first portion modifies the interface initially made between the strained semiconductor of the first portion and the material of the buried dielectric layer. This modification of this interface makes it possible to obtain the second portion which forms a mechanical barrier, or mechanical support element, enabling the remaining strained semiconductor of the strained semiconductor region to bear mechanically against this second portion of material. In removing the etching mask, excessive relaxation of the strained semiconductor is thereby avoided thanks to the mechanical support element(s) formed. The modification of the interface between the strained semiconductor of the first portion and the material of the buried dielectric layer is obtained even when the strained semiconductor of the first portion is etched and replaced by an identical strained semiconductor.

Excessive relaxation of the strained semiconductor is avoided whatever the depth of the etching carried out, which makes this method compatible with the production of isolation trenches made through the active layer and at least one part of one or more layers arranged under the active layer. This method is notably well suited to produce a substrate in which FDSOI (Fully-Depleted Silicon On Insulator) type components are manufactured.

Another advantage of this method is that its implementation does not resort to etching masks requiring a different alignment from those used for the production of isolation trenches.

Such a substrate is well suited for producing, using CMOS technology, one or more P-type FETs having a compressively strained channel in the strained semiconductor region, and one or more other FETs, for example of P-type or N-type and having a channel, compressively strained or not, in another region of the substrate.

Such a substrate is well suited to the production of FDSOI type FETs, and/or P-type FETs including a channel of compressively strained SiGe and N-type transistors including a channel of tensile strained Si or SiGe.

Such a substrate is also well suited to the production of FinFET type, or to nanowires (also called NW) or nanosheets (also called NS or NSH) types FETs.

The first lateral edge(s) formed by the strained semiconductor region correspond to faces of parts of the superficial layer exposed by the etching of the superficial layer and which are for example oriented substantially perpendicularly to the main faces of the superficial layer (which correspond to the faces of largest dimensions of the superficial layer).

The pattern of the etching mask corresponds to the design formed by the openings passing through the mask, in the main plane of the etching mask, that is to say the plane parallel to the main faces of the mask and which correspond to the faces of greatest dimensions of the mask.

The second portion(s) may comprise a single material or several different materials (in terms of nature and/or chemical composition, physical and/or chemical properties, etc.) of the strained semiconductor. In an alternative, the second portion(s) may comprise a material identical to the strained semiconductor.

In a first embodiment, the step of modifying the first strained semiconductor portion may comprise the implementation of a chemical reaction transforming the strained semiconductor.

The chemical reaction may correspond to an oxidation and/or a nitridation of the strained semiconductor. In this case, the material of the second portion comprises at least one oxide of the strained semiconductor and/or a nitride of the strained semiconductor.

The strained semiconductor may correspond to compressively strained SiGe, the superficial layer being able to be produced by germanium enrichment in a silicon layer.

Moreover, the compressively strained semiconductor which corresponds to SiGe may comprise a germanium concentration between around 20% and 50%. It is however possible that this germanium concentration between around 20% and 100% (with, in the case of a germanium concentration equal to 100%, a compressively strained semiconductor corresponding to germanium). The germanium concentration in the semiconductor here corresponds to the atomic percentage of germanium within this semiconductor.

Before the implementation of germanium enrichment, the silicon layer may comprise tensile strained silicon. For example, the silicon layer may correspond to the superficial layer of an sSOI (strained Silicon On Insulator) substrate. A part of the germanium atoms introduced into the silicon layer during the germanium enrichment enable to cancel the tensile strain, and the other germanium atoms introduced into the silicon layer enable to provide the compressive strain.

According to a particular configuration, the method may be such that:
- the strained semiconductor region has, in a main plane of the superficial layer, a substantially rectangular shape;
- the pattern of the etching mask is such that the etching of the superficial layer exposes at least two opposite first lateral edges and formed by the part of the strained semiconductor region;
- the step of modification is implemented such that it modifies at least two first strained semiconductor portions that form the two first lateral edges and which are in contact with the buried dielectric layer.

In this case, it is possible that during the removal of the etching mask, the strain in the strained semiconductor region partially relaxes along a direction parallel to the two first lateral edges, and excessive relaxation of the strain along the direction perpendicular to the two first lateral edges is avoided.

The main plane of the superficial layer corresponds to a plane parallel to the substrate, that is to say parallel to the main faces of the superficial layer which correspond to the faces of largest dimensions of the superficial layer.

In addition, the method may be such that:
- the pattern of the etching mask is such that the etching of the superficial layer further exposes at least two opposite second lateral edges, formed by the part of the strained semiconductor region and substantially perpendicular to the two first lateral edges;
- the step of modification is implemented such that it modifies at least four first strained semiconductor portions which form the two first lateral edges and the two second lateral edges and which are in contact with the buried dielectric layer.

In this case, during the removal of the etching mask, the strain in the strained semiconductor region is conserved along directions perpendicular to the first lateral edges and to the second lateral edges, and excessive relaxation of the strained semiconductor is avoided along these directions.

The isolation trench may surround the strained semiconductor region.

The etching mask may comprise at least one tensile or compressively strained material. Such an etching mask makes it possible to modify the strain in the semiconductor on which the mask is produced. For example, when the initial strain in the strained semiconductor corresponds to a compressive strain, such an etching mask may make it possible to obtain an unstrained, or even tensile strained, semiconductor.

The invention also relates to a method for producing at least one FET, wherein said at least one FET is produced in the strained semiconductor region of a semiconductor substrate obtained by the implementation of the method of producing a substrate described above.

BRIEF DESCRIPTION OF THE DRAWINGS

The present invention will be better understood on reading the description of exemplary embodiments given for purely indicative purposes and in no way limiting while referring to the appended drawings in which.

Figure 1:
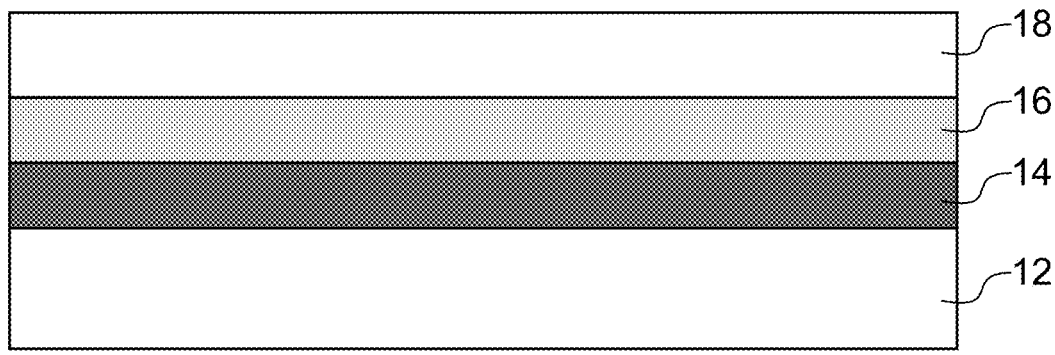
FIGS. 1 to 5 show a method for producing a semiconductor substrate including a layer of compressively strained semiconductor.

Identical, similar or equivalent parts of the different figures described hereafter bear the same numerical references in order to make it easier to go from one figure to the next.

The different parts shown in the figures are not necessarily according to a uniform scale, in order to make the figures more legible.

The different possibilities (alternatives and embodiments) should be understood as not being mutually exclusive and may be combined together.

DETAILED DESCRIPTION OF PARTICULAR EMBODIMENTS

A first embodiment of a method for producing a semiconductor substrate 100 suited to the production of semiconductor devices such as one or more FETs in at least one strained semiconductor region of the substrate, is shown in FIGS. 6 to 10.

This method is implemented from a SOI substrate. The SOI substrate comprises a support layer 102, or thick layer, on which is located a buried dielectric layer 104 including for example $SiO_2$ and of which the thickness is for example between around 25 nm and 200 nm, and a superficial layer 106 of which the thickness is for example between around 5 nm and 20 nm.

As a function of the electronic components to produce in the substrate 100, different regions including materials subjected to different strains may be produced in the superficial layer 106. In the first embodiment described here, the substrate 100 is intended to comprise P-type FETs of which the active zones are produced in regions of compressively strained semiconductor, and N-type FETs of which the active zones are produced in regions of unstrained semiconductor. To do so, the superficial layer 106 comprises first regions 110 of compressively strained SiGe and second regions 112 of unstrained SiGe or unstrained Si. In FIGS. 6 to 10, a first region 110 surrounded by second regions 112 are shown.

Figure 2:
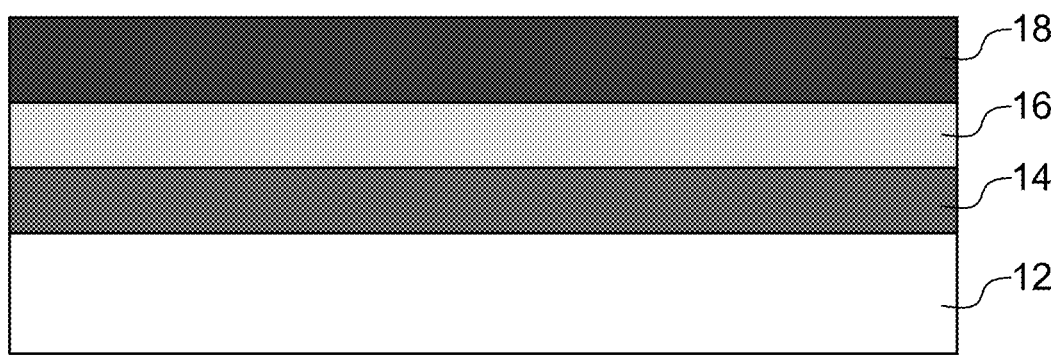
Figure 3:
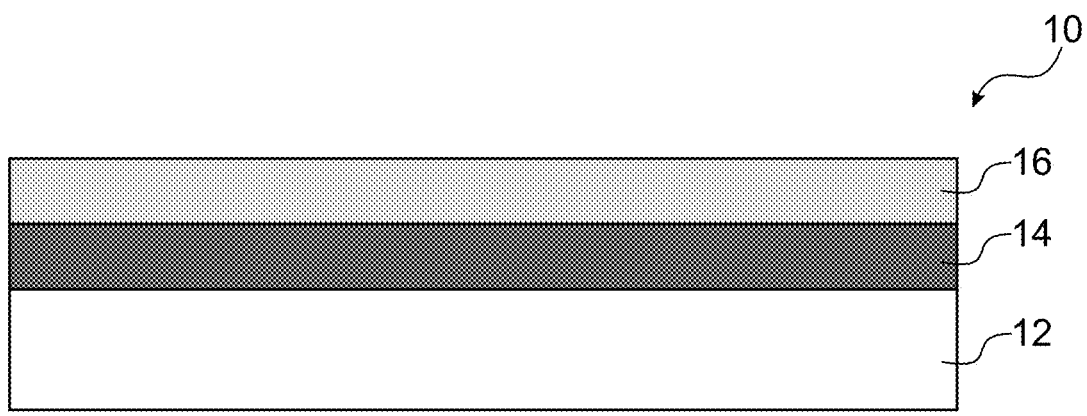
Figure 4:
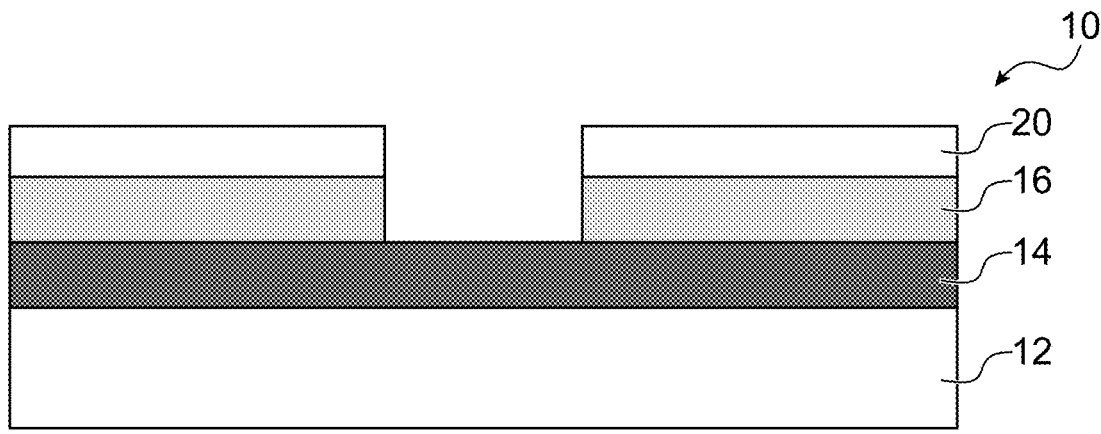
Figure 5:
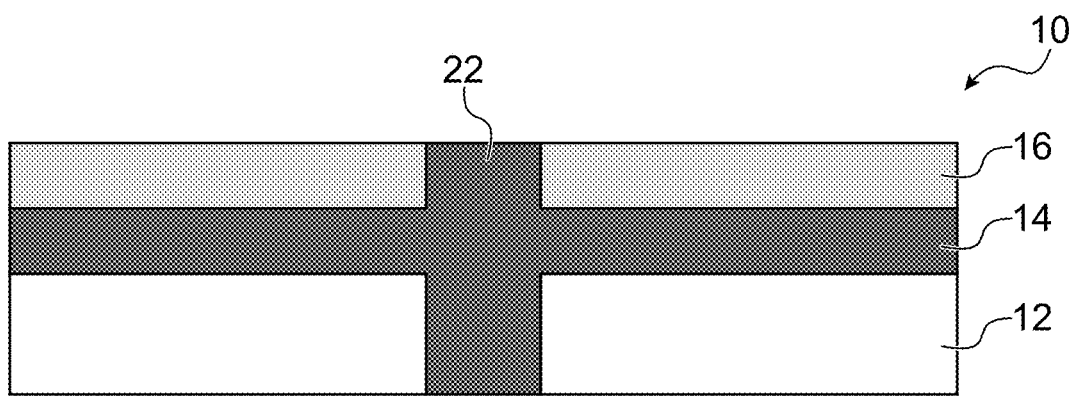

To obtain these regions 110 and 112, the superficial layer 106 is for example produced from a silicon layer in which the first regions 110 of compressively strained SiGe are produced by germanium enrichment, as described previously in relation with FIGS. 1 to 3. During this germanium enrichment method, a mask covers the parts of the silicon layer intended to form the second regions 112 in order that the silicon of these parts covered by the mask is not modified by the germanium enrichment implemented to form the compressively strained SiGe of the first regions 110.

The mask used to cover the regions of the semiconductor layer that will not be modified by the germanium enrichment is for example formed of a first layer of $SiO_2$ of thickness between around 5 nm and 10 nm, and of a second layer of SiN of thickness between around 30 nm and 100 nm.

After having produced the mask on the silicon layer, the steps making it possible to transform the silicon of the future first regions 110 into compressively strained SiGe are implemented. To do so, a SiGe layer is firstly formed by epitaxy on the parts of the silicon layer that are not covered by the mask. This SiGe layer has for example a thickness between around 5 nm and 30 nm, and the percentage germanium in the SiGe of this layer, that is to say the atomic percentage of germanium in this SiGe, is for example between around 20% and 50%.

A step of thermal oxidation of this SiGe layer is next implemented. This oxidation may comprise for example a first step of dry oxidation, for example by rapid thermal oxidation (RTO) implemented at a temperature between around 850° C. and 950° C., or between 900° C. and 1100° C. to diffuse the germanium atoms. A second annealing step under a neutral atmosphere, for example under an $N_2$ atmosphere, may be implemented, for example at a temperature above the implementation temperature of the preceding oxidation and between around 950° C. and 1100° C. to homogenise the concentration of diffused germanium atoms. The temperatures involved during this oxidation are such that they are below the melting temperature of the strained semiconductor of the first regions 110. These two steps may be implemented a single time, with in this case a first oxidation step implemented for a sufficient duration in order to obtain, at the end of this first step, the desired germanium concentration in the semiconductor of the first regions 110 of the superficial layer 106. In an alternative, these two steps may be implemented several times one after the other in a cyclic manner, with in this case reduced durations of implementation of the first oxidation steps. The germanium enrichment of the semiconductor of the first regions 110 obtained may be such that the level of germanium in the strained SiGe obtained is between around 20% and 50%.

The duration of the thermal oxidation during which the semiconductor is exposed to high temperatures notably depends on the thickness of the SiGe layer formed on the silicon layer, as well as the germanium concentration of the SiGe of this layer.

The oxidation causes a migration of germanium atoms coming from the SiGe layer into the silicon of the first regions 110 of the superficial layer 106. This germanium enrichment of the silicon modifies the nature of this semiconductor, which becomes compressively strained SiGe. At the end of this step, the semiconductor of the first regions 110 of the superficial layer 106, that is to say the semiconductor of the superficial layer 106 that is not covered by the mask, corresponds to compressively strained SiGe. Thanks to the presence of the mask covering the second regions 112 of the superficial layer 106, the nature of the silicon of these second regions 112 is not modified by the implementation of these steps. An oxide layer formed by the oxidation of the SiGe layer and mainly including for example $SiO_2$, and the mask used, are next removed.

According to another example, when the silicon layer comprises a thickness equal to around 11 nm, and when the SiGe layer made on the silicon layer comprises $Si_{0.75}Ge_{0.25}$ and a thickness equal to around 8.5 nm made by RT-CVD (Rapid Thermal Chemical Vapor Deposition), the step of thermal oxidation of the SiGe layer may correspond to the implementation of a rapid thermal oxidation at a temperature equal to around 1100° C. for a duration between around 45 seconds and 50 seconds. The result is the formation of a region 110 of compressively strained SiGe having a thickness between around 12 nm and 13 nm and in which the germanium concentration varies linearly from the upper surface (that in contact with the SiGe layer) where the atomic percentage of germanium is equal to around 27% up to the interface with the buried dielectric layer 104 where this atomic percentage is equal to around 5%.

The isolation of the different regions of the superficial layer 106 is here intended to be ensured by isolation trenches, for example of STI type.

Figure 6:
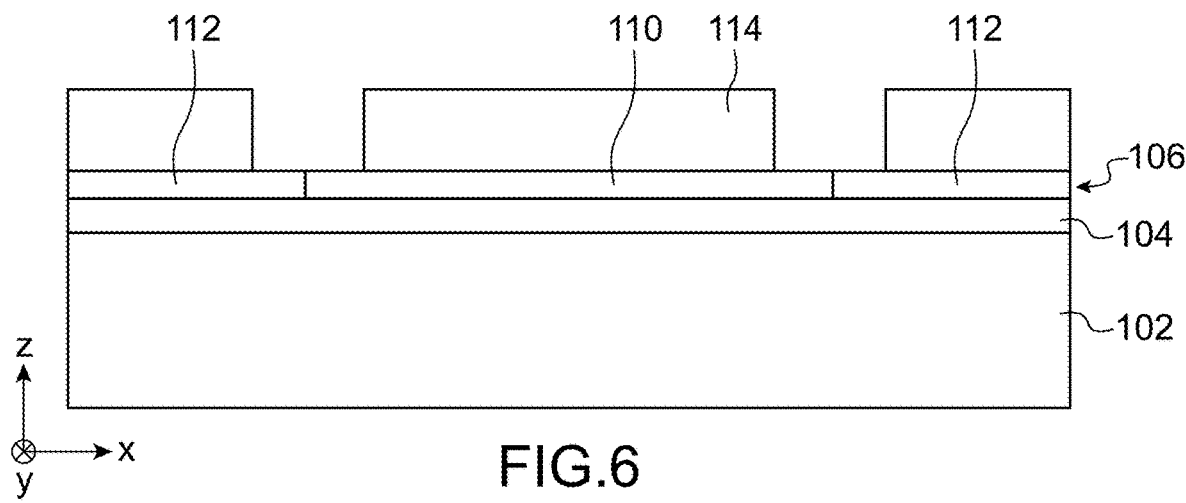
FIGS. 6 to 10 show the steps of a method for producing a semiconductor substrate according to a first embodiment.

To do so, an etching mask 114 is produced on the superficial layer 106 (FIG. 6). The openings formed through the mask 114, corresponding to the pattern of the etching mask 114, define the isolation trench or trenches intended to be produced at least through the superficial layer 106. In the exemplary embodiment described here, the isolation trenches are intended to pass through the layers 106 and 104 and a part of the thickness of the support layer 102, in order to electrically isolate from each other not only the different regions produced in the superficial layer 106, but also the parts of the support layer 102 located under these regions in order to be able to achieve a biasing of these parts of the support layer 102 independently of each other. The layers 106, 104 and 102 are thus etched according to the pattern of the mask 114 (see FIG. 7), forming isolation trenches 116 completely passing through the layers 106 and 104 and a part of the thickness of the support layer 102.

Figure 7:
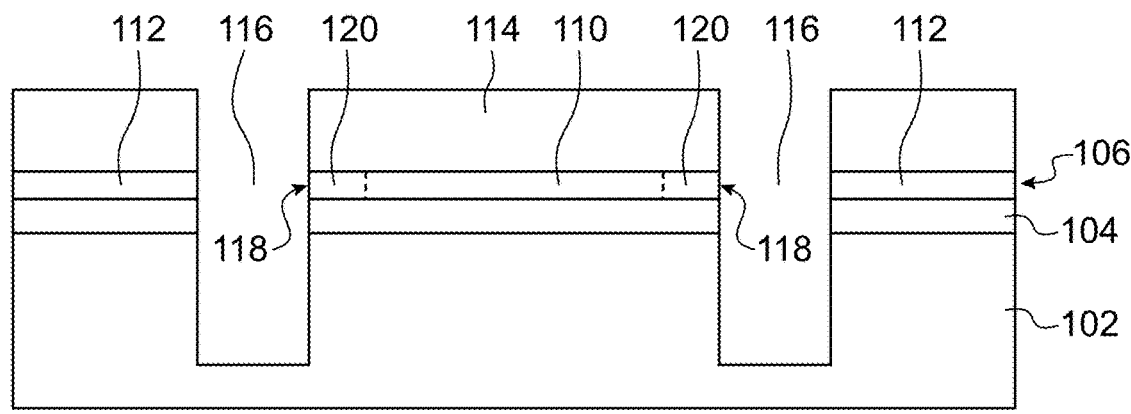
Figure 8:
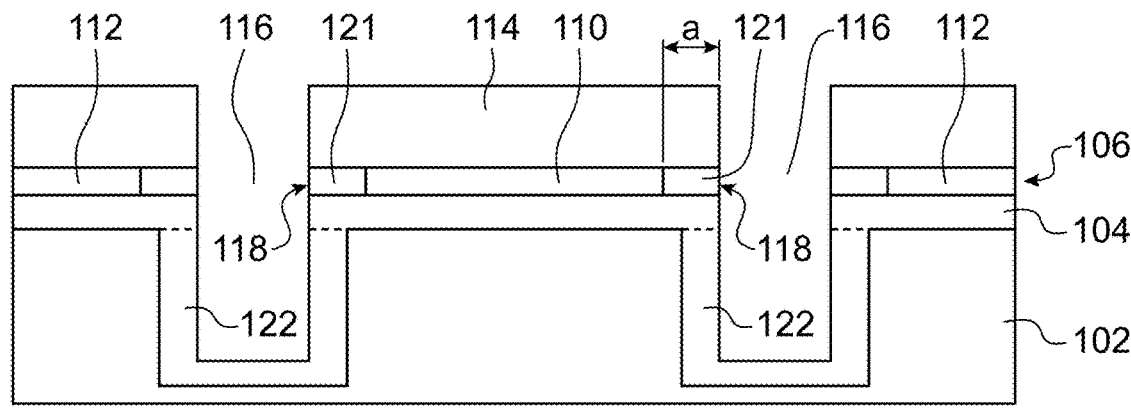
Figure 9:
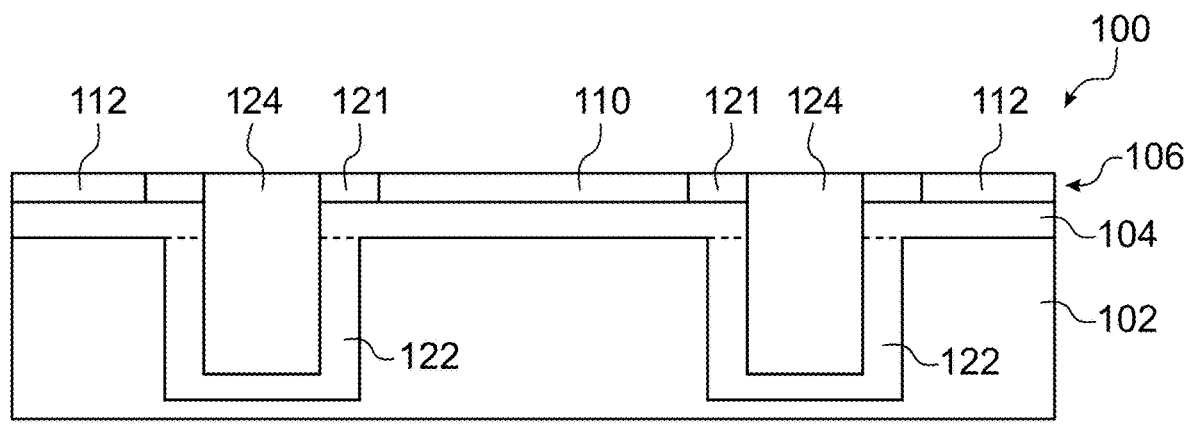

This etching of the superficial layer 106 exposes first lateral edges 118 and second lateral edges 130 of the first region 110 that is covered by the mask 114. In FIGS. 7 and 8, only the two first lateral edges 118 are visible, the two second lateral edges 130 being visible in FIG. 10.

When the strain in the material of the mask 114 is neutral or close to a neutral strain, the mask 114 forms a mechanical element contributing to maintaining the compressive strain of the semiconductor of the first region 110, and does so even though the isolation trenches 116 have been etched around the first region 110.

In order to avoid excessive relaxation of the strained semiconductor of the first region 110 when the mask 114 is removed later, first strained semiconductor portions 120 forming part of the first region 110 and forming the lateral edges 118 and 130 are modified into second portions 121 of material forming, during the removal of the mask 114, mechanical support elements arranged against the first region 110, avoiding the strained semiconductor from excessively relaxing during the removal of the mask 114.

In the first embodiment described here, the modification of the first portions 120 corresponds to the implementation of a chemical reaction transforming the strained semiconductor of the first portions 120 into another material forming the second portions 121.

According to a first exemplary embodiment, this chemical reaction corresponds to an oxidation of the strained semiconductor. This oxidation corresponds for example to a thermal oxidation, for example of RTO type, or a plasma enhanced oxidation, or more generally any dry or wet oxidation suitable for transforming the strained semiconductor of the first portions 120.

According to a second exemplary embodiment, this chemical reaction corresponds to a nitridation, for example plasma enhanced. As an example, this nitridation may be implemented by resorting to electron beams, or instead be of type PECVD (Plasma-Enhanced Chemical Vapour Deposition), ECR (Electron Cyclotron Resonance), ion beam, low energy implantation of nitrogen atoms, or instead using an inductively coupled nitrogen plasma, etc.

Thus, the first strained semiconductor portions 120, here strained SiGe, are transformed into second portions 121 of material which is, in this first embodiment, different from the strained semiconductor (see FIG. 8). According to the exemplary embodiments described above, the material of the second portions 121 is for example semiconductor oxide and/or semiconductor nitride.

By transforming the material of the first portions 120 without modifying that of the remainder of the region 110, the interface between the strained semiconductor of the region 110 and the dielectric material of the buried dielectric layer 104 is modified at the first and second lateral edges 118, 130. The second portions 121 then form mechanical barriers, or mechanical support elements, which prevent, during the removal of the mask 114, excessive relaxation of the strained semiconductor of the region 110 which takes place notably at the interface with the buried dielectric layer 104.

This modification is carried out such that the width of the first portions 120, along a direction substantially perpendicular to the lateral edges 118, 130 (corresponding to the dimension "a" in FIG. 8) is between around 3 nm and 25 nm, or between 5 nm and 20 nm. In the exemplary embodiment described here, the semiconductor of the layer 102 is also exposed to the chemical reaction implemented to transform the strained semiconductor of the first portions 120. Thus, the semiconductor of the layer 102 that is exposed in the trenches 116 during the implementation of the chemical reaction is also transformed into semiconductor oxide (for example into $SiO_2$) and/or into semiconductor nitride (for example into $Si_3N_4$). A $SiO_2$ layer 122 is thus formed in the trenches 116 at the lateral walls and the bottom wall of the trenches 116.

The trenches 116 are next filled with one or more dielectric materials, for example $SiO_2$, in order to form isolation trenches 124. The deposition of the dielectric material(s) may be followed by a densification annealing. The mask 114 is next removed without the strained semiconductor of the first region 110 relaxing excessively, completing the production of the substrate 100 (see FIG. 9).

It is possible, depending on the deposition technique used, that the mask is also covered with the dielectric material deposited to form the isolation trenches 124. In this case, the material arranged on the mask may be eliminated, for example by chemical mechanical polishing, or CMP.

Figure 10:
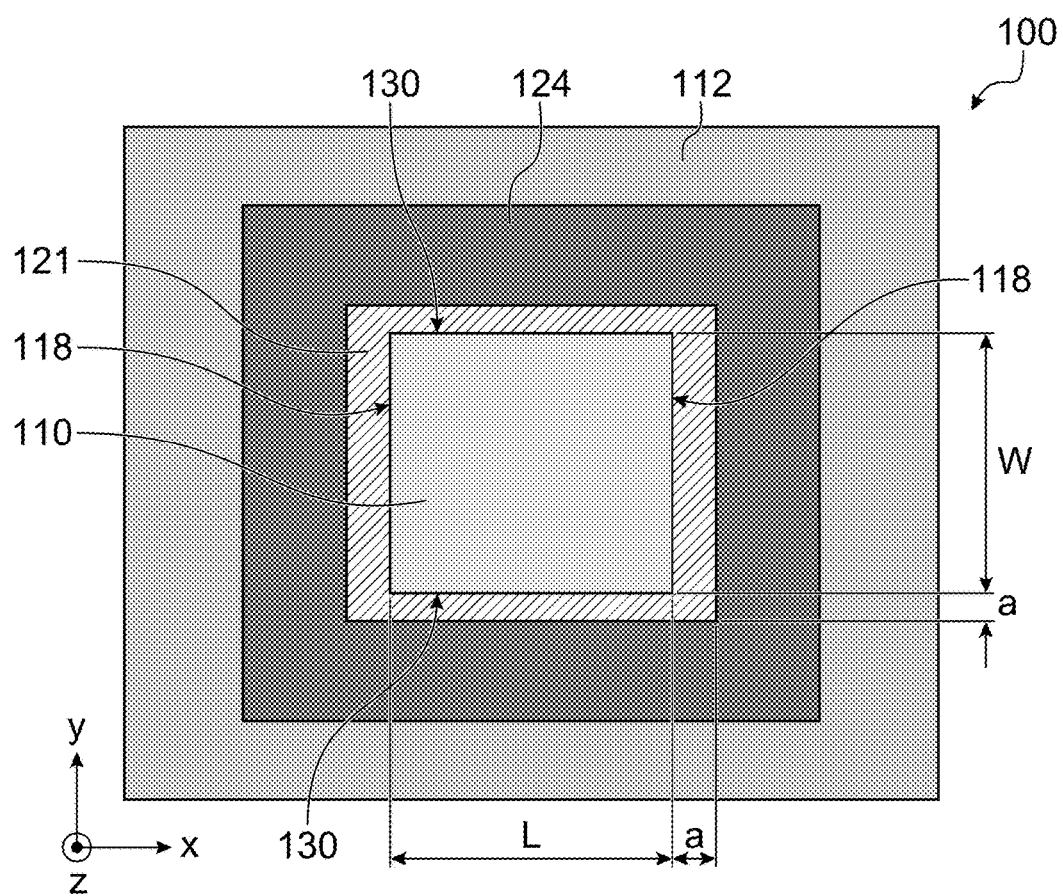

FIG. 10 shows a top view of the part of the superficial layer 106 including the first region 110 in which P-type transistors are intended to be produced. In the main plane of the superficial layer 106 (plane substantially parallel to the interface between the superficial layer 106 and the buried dielectric layer 104, or plane parallel to the faces of largest dimensions of the superficial layer 106, which is parallel to the plane (X,Y)), the first region 110 has for example a substantially rectangular shape, as is the case in FIG. 10. This first region 110 of the superficial layer 106, including compressively strained SiGe, is surrounded by the second portions 121 which include, in the exemplary embodiments described, oxide formed by oxidation of the SiGe of the first portions 120 and/or nitride formed by nitridation of the SiGe of the first portions 120 and which form the lateral edges 118, 130. The isolation trenches 124 surround these portions 121. The dimension designated "L" corresponds to the length of the first region 110, and is parallel to the length of channels of the transistors that will be produced in this first region 110 (the length of the channels corresponding to the dimension of the channels parallel to the direction of transport of charges in the channels). The dimension designated "W" corresponds to the width of the first region 110, and is parallel to the width of the channels of the transistors.

In an alternative, the first region 110 may have, in the main plane of the layer 106, a shape composed of several juxtaposed rectangles of which the edges are not aligned and/or are of different dimensions, or instead any other shape.

With the portions 121 arranged against all the edges of the first region 110 of the superficial layer 106, the compressive strain is conserved in the semiconductor of the first region 110 of the superficial layer 106 and excessive relaxation of this strain is avoided notably along two directions substantially perpendicular to each other, one of these two directions corresponding to the direction of circulation of the current in the channels of the transistors that will be produced in the first region 110 (these two directions correspond to those parallel to the X and Y axes visible in FIG. 10).

Figure 11:
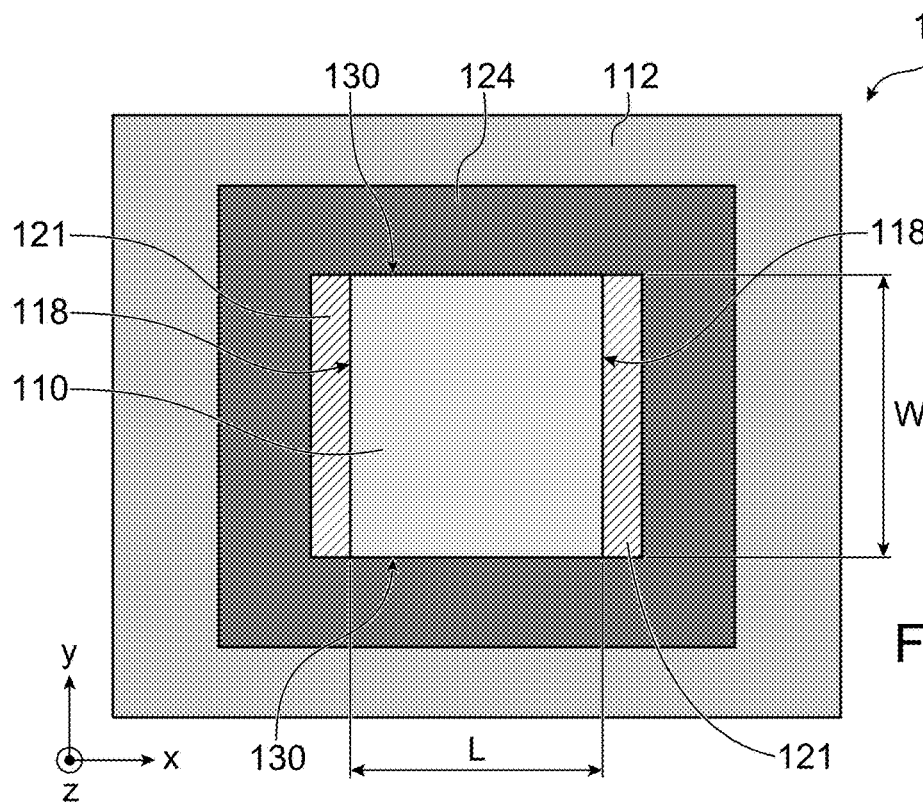
FIG. 11 shows a semiconductor substrate obtained by the implementation of a production method according to an alternative of the first embodiment.

According to an alternative, it is possible that the portions 121 are not arranged against all the edges of the first region 110. FIG. 11 shows such an alternative embodiment. In this figure, the portions 121 are located between the two opposite first edges 118 of the first region 110 of the superficial layer 106. The two portions 121 are each oriented, that is to say include their greatest dimension, substantially perpendicularly to the length of the channels of the transistors intended to be produced in the first region 110. No portion 121 is arranged against the second edges 130 of the region 110 that are substantially parallel to the length L. According to this alternative, excessive relaxation of the compressive strain is prevented along the axis parallel to the length L thanks to the presence of the portions 121 against the first edges 118 of the region 110. A relaxation of the strain may on the other hand occur along the axis parallel to the width W of the region 110 on account of the absence of portions 121 against the second edges 130. Thus, conditions favourable to the maintaining of the compressive strain along the length L and conditions favourable to the relaxation of the compressive strain along the width W are obtained. This configuration favours obtaining a compressive strain of increased uniaxial character along the axis parallel to the length L.

In the first embodiment described above, the portions 121 are formed at lateral edges exposed during the production of isolation trenches 124. In an alternative, it is possible to form the portions 121 at etched zones that do not correspond to the isolation trenches 124. In this case, the trenches 116 may be produced only through the superficial layer 106 and not through the dielectric layer 104 and the support layer 102.

In the first embodiment described above, the semiconductor of the support layer 102 forming part of the lateral walls of the trenches 116 undergoes the chemical reaction implemented to form the second portions 121. In order to minimise the impact of this oxidation on the semiconductor of the support layer 102, it is possible that this oxidation is implemented in a selective manner, that is to say such that the oxidation of the SiGe of the first portions 120 is quicker than that of the silicon of the support layer 102. Such a selective oxidation corresponds for example to a wet oxidation such as described in the document "Wet oxidation of GeSi strained layers by rapid thermal processing" of D. K. Nayak et al., Appl. Phys. Lett. 57, 369 (1990).

Figure 12:
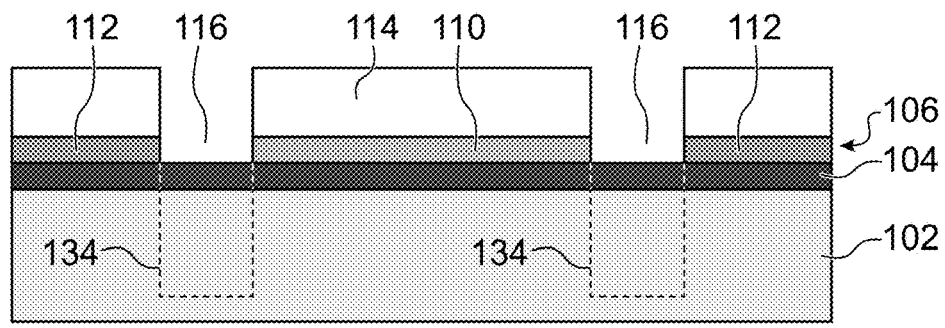
FIGS. 12 to 14 show alternative embodiments of the method for producing the semiconductor substrate according to the first embodiment.
Figure 13:
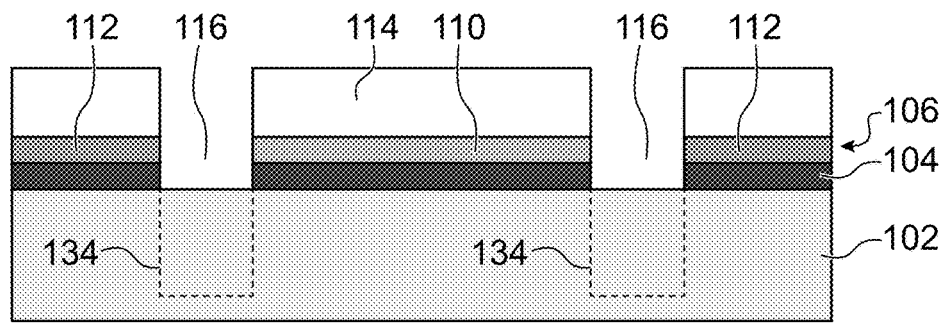
Figure 14:
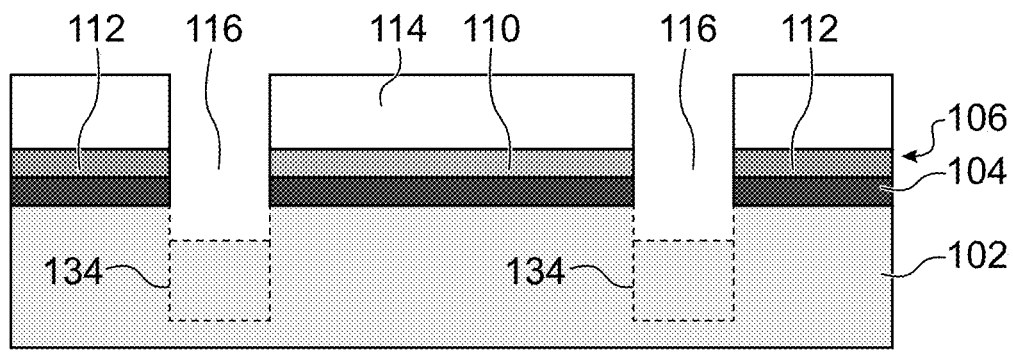

It is also possible, in order to minimise the impact of the chemical reaction carried out to form the portions 121, to produce the trenches 116 in several steps. For example, from the step described previously in relation with FIG. 6, it is possible to produce the trenches 116 only through the superficial layer 106 (as shown in FIG. 12) or through the superficial layer 106 and at least one part of the thickness of the buried dielectric layer 104 (as shown in FIG. 13), or through the layers 104 and 106 and a part of the thickness of the layer 102, while being below the final thickness desired for the isolation trenches 124 (as shown in FIG. 14). In FIGS. 12 to 14, the desired final depth for the isolation trenches 124 is represented in dotted lines and referenced 134. The step(s) of modifying the strained semiconductor of the first portions 120 are next implemented, then the etching of the trenches 116 is completed until the desired depth for the isolation trenches 124 is reached. It should be noted that this latter etching step eliminates the semiconductor oxide and/or nitride formed at the bottom wall of the trenches 116 when the transformation of the semiconductor of the first portions 120 comprises the implementation of an oxidation and/or a nitridation of this semiconductor (in the case of FIG. 14, the semiconductor oxide and/or nitride made at the bottom wall of the trenches 116 may be conserved). The dielectric material of the trenches 124 is next deposited in the trenches 116.

In the first embodiment described previously, the second portions 121 are obtained by chemical reaction transforming the material of the first portions 120. In an alternative, prior to the implementation of this chemical reaction, it is possible to carry out a removal, or an etching, of a part of the strained semiconductor of these first portions 120, for example over a width (parallel to the dimension "a" described previously) for example between around 5 nm and 10 nm, then to implement the chemical reaction as described previously from the remaining semiconductor of the first portions 120.

Figure 15:
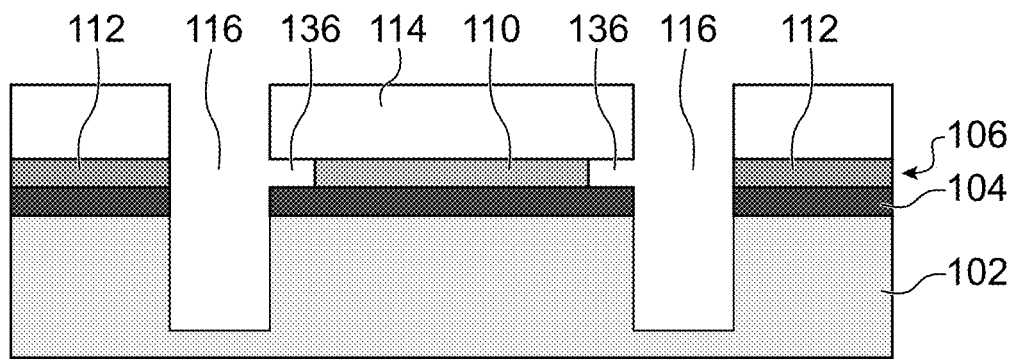
FIG. 15 shows an intermediate structure obtained during the implementation of the method for producing the semiconductor substrate according to a second embodiment.

According to a second embodiment, the modification of the first portions 120 may correspond to a replacement of the strained semiconductor of these first portions 120 by another material forming the second portions 121. To do so, after having etched the superficial layer 106, an etching of the first portions 120 is implemented, thereby forming cavities 136 between the mask 114 and the buried dielectric layer 104 (see FIG. 15). Another material, different or not from the strained semiconductor, is next deposited in the cavities 136 to form the second portions 121.

In this second embodiment, the second portions 121 may be produced at the same time as the isolation trenches 124. In this case, the material(s) of the second portions 121 are dielectric and similar to that or those of the isolation trenches 124. Advantageously, in this second embodiment, a first oxidation may be implemented (for example a rapid thermal oxidation) to obtain an oxide layer of thickness between 1 nm and 10 nm. This oxidation may be followed by a deposition of nitride, for example of type SACVD (sub-atmospheric chemical vapour deposition), PECVD, or instead ALD (atomic layer deposition), for example SiBCN and/or SiN, of thickness between around 2 and 15 nm, and/or a deposition of oxide for example $SiO_2$, deposited for example by HDPCVD or any other suitable deposition.

In an alternative, it is possible that the material deposited in the cavities 136 corresponds to a semiconductor, such as for example silicon and/or Ge and/or SiGe. Due to the fact that this semiconductor has not been subjected to the method of condensation of the first region 110, this semiconductor indeed forms a mechanical support element making it possible to prevent the relaxation of the strained SiGe during the removal of the mask 114.

This semiconductor of the second portions 121 may be deposited in an amorphous form, then a re-crystallisation annealing may be implemented. The re-crystallisation may also intervene in the course of a later annealing implemented for example in the course of the production of the transistors in the substrate 100. In an alternative, the semiconductor may be deposited in crystalline form, for example by growth. A selective epitaxy may for example be implemented.

In addition, it may also be envisaged to carry out a chemical reaction of the deposited semiconductor, for example an oxidation and/or a nitridation.

Generally speaking, different dielectric and/or semiconductor materials may be combined to form the second portions 121.

Advantageously, when the material deposited and forming the second portions 121 is a semiconductor, the trenches 116 are etched such that they pass through the dielectric layer 104, and even a part of the support layer 102. Thus, after the deposition of the semiconductor in the cavities, the semiconductor located in the trenches 116 is eliminated by the etching implemented to complete the etching of the trenches 116, eliminating any link between the semiconductor deposited in the cavities and the semiconductor of the support layer 102.

The alternatives described previously in relation with the first embodiment, notably the production of trenches 116 in several steps as described previously in relation with FIGS. 12 to 14, may apply to this second embodiment. In this case, the material that is deposited in the trenches 116 and not in the cavities 136 is eliminated by the etching implemented to complete the production of the trenches 116.

In the embodiments and the alternatives described previously, the second regions 112 adjacent to the first region 110 do not comprise the strained semiconductor arranged in the first region 110. In an alternative, it is possible that these second regions 112 comprise the same strained semiconductor as that of the first region 110. In this case, portions 121 forming mechanical supports may be produced at the lateral edges of these second regions 112, facing the second portions 121 forming the mechanical support elements for the first region 110.

In the embodiments described previously, the compressively strained semiconductor corresponds to SiGe. The method described previously may however apply to other semiconductors and/or to a different strain.

In the embodiments and alternatives described above, the semiconductor of the first region 110 corresponds to a compressively strained semiconductor. This strain may be modulated or modified by producing the mask 114 such that said mask is also produced with a strained material. Thus, by producing the mask 114 with a tensile strained material, the compressive strain of the semiconductor of the region 110 may be reinforced.

In an alternative, by producing the mask 114 with a compressively strained material, the initial compressive strain of the semiconductor of the region 110 may be modified to the point of becoming zero, or even to become a tensile strain. Such a mask 114 may comprise SiN, with different types of strain (compressive or tensile) and different possible levels of strain. This mask 114 may be produced according to for example the methods described in the document "A comparison of the mechanical stability of silicon nitride films deposited" of P. Morin et al., Applied Surface Science, vol. 260, 1 Nov. 2012, pages 69-72.

Figure 16:
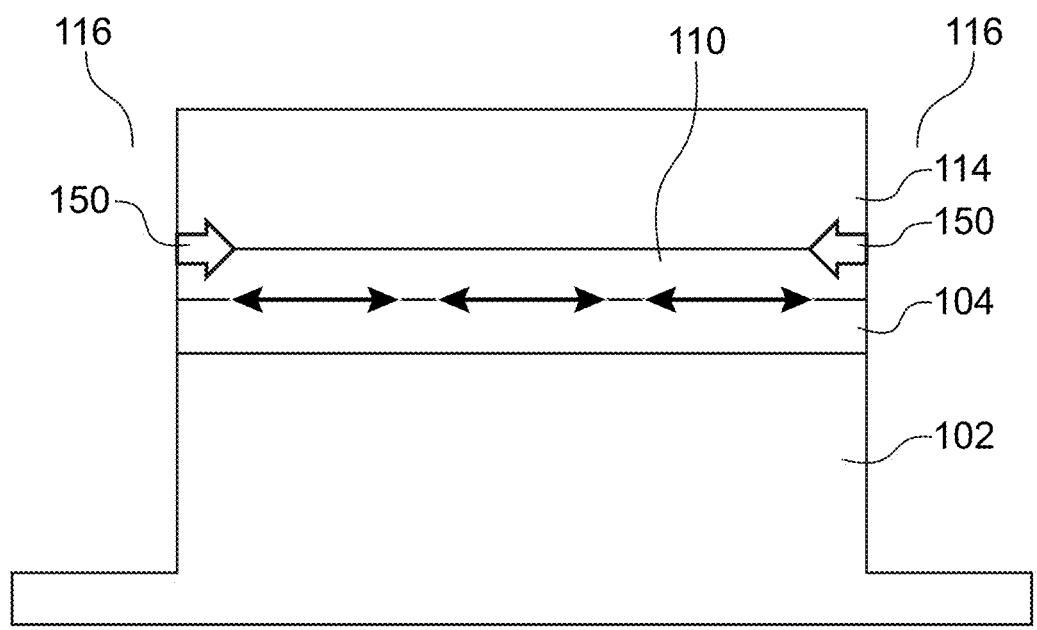
FIGS. 16 and 17 show intermediate structures obtained during the implementation of the method for producing the semiconductor substrate according to alternative embodiments.

FIG. 16 shows a first exemplary embodiment of this alternative wherein the mask 114 comprises a tensile strained material. The mask 114 provides an additional compressive strain to the material of the first region 110 which corresponds to initially compressively strained SiGe. This additional compressive strain is represented symbolically in FIG. 16 by the arrows referenced 150. Such a highly compressively strained material of the first region 110 may for example be used for the production of PMOS transistors.

Figure 17:
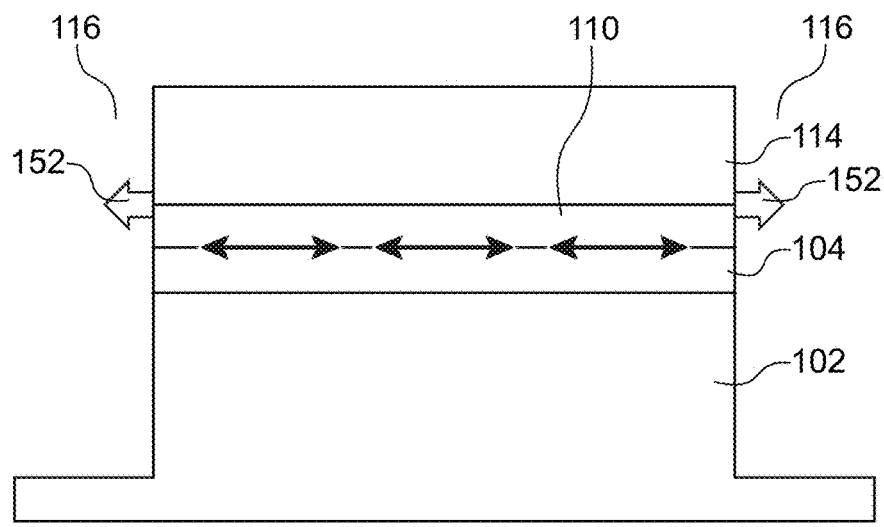

FIG. 17 shows a second exemplary embodiment of this alternative wherein the mask 114 comprises a compressively strained material. The mask 114 provides a tensile strain to the material of the first region 110 which corresponds to initially compressively strained SiGe. The tensile strain provided by the mask 114 is represented by the arrows referenced 152. The provision of this tensile strain may make it possible to obtain, in the material of the first region 110, a substantially zero strain or even a tensile strain.

It is for example possible to produce, in a substrate including the layers 102, 104 and 106 and wherein the layer 106 comprises compressively strained SiGe obtained by condensation of Ge, regions of the layer 106 on which the mask 114 comprises a neutral or tensile strain and in which a compressive strain is conserved or increased in these regions of SiGe of the layer 106, used for example for the production of PMOS transistors, and other regions of the layer 106 on which the mask 114 comprises a compressive strain and in which a neutral or tensile strain is obtained in these regions of SiGe of the layer 106 used for example for the production of NMOS transistors.

Figure 18:
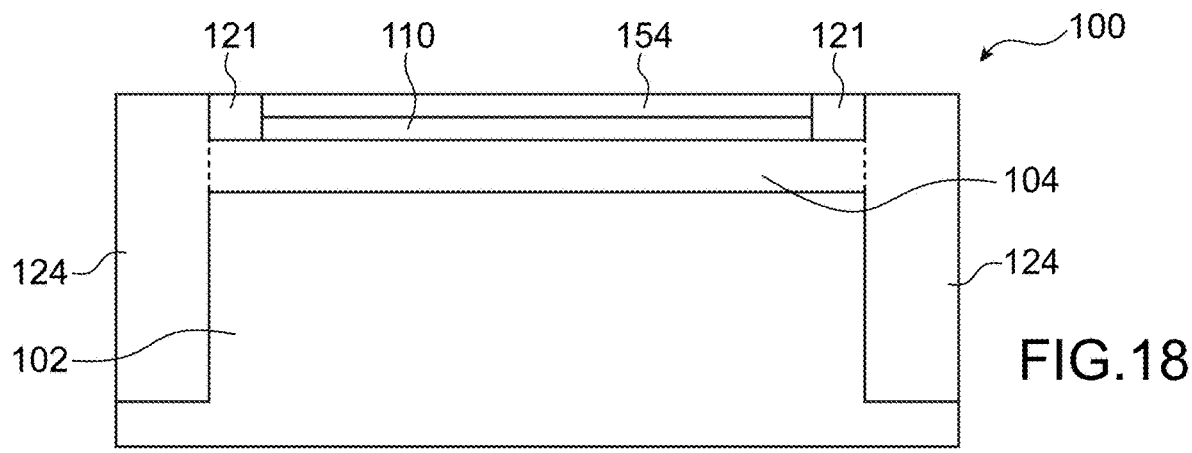
FIG. 18 shows a semiconductor substrate obtained by the implementation of a production method according to an alternative embodiment.

From the unstrained or tensile strained SiGe of the first region 110 described above, it is possible to carry out a thinning of this SiGe, then to implement an epitaxy to make silicon 154 grow on the remaining thickness of SiGe. The substrate 100 obtained is shown in FIG. 18.

The alternatives described above may apply to the two embodiments described previously.

The steps below correspond to the steps implemented to produce the substrate 100 according to the configuration shown in FIG. 11, according to a first exemplary embodiment:

lithography and etching of the first trenches 116 oriented parallel to the X axis;
deposition of the isolation dielectric material in these first trenches 116, with a chemical mechanical polishing to eliminate the dielectric material located outside of the first trenches 116;
lithography and etching of the second trenches 116 oriented parallel to the axis Y;
production of portions 121 via a modification of the first portions 120 forming the first lateral edges 118 in these second trenches 116;
deposition of the isolation dielectric material in the second trenches 116, with a chemical mechanical polishing to eliminate the dielectric material located outside of the second trenches 116.

The steps below correspond to the steps implemented to produce the substrate 100 according to the configuration shown in FIG. 11, according to a second exemplary embodiment:

lithography and etching of the second trenches 116 oriented parallel to the Y axis;
production of portions 121 via a modification of the first portions 120 forming the first lateral edges 118 in these second trenches 116;
deposition of the isolation dielectric material in the second trenches 116, with a chemical mechanical polishing to eliminate the dielectric material located outside of the second trenches 116.

lithography and etching of the first trenches 116 oriented parallel to the X axis;
deposition of the isolation dielectric material in these first trenches 116, with a chemical mechanical polishing to eliminate the dielectric material located outside of the first trenches 116.

The steps below correspond to the steps implemented to produce the substrate 100 according to the configuration shown in FIG. 11, according to a third exemplary embodiment:

lithography and etching of the second trenches 116 oriented parallel to the Y axis;
production of portions 121 via a modification of the first portions 120 forming the first lateral edges 118 in these second trenches 116;
lithography and etching of the first trenches 116 oriented parallel to the X axis;
deposition of the isolation dielectric material in the first and second trenches 116, with a chemical mechanical polishing to eliminate the dielectric material located outside of the trenches 116.

Figure 19:
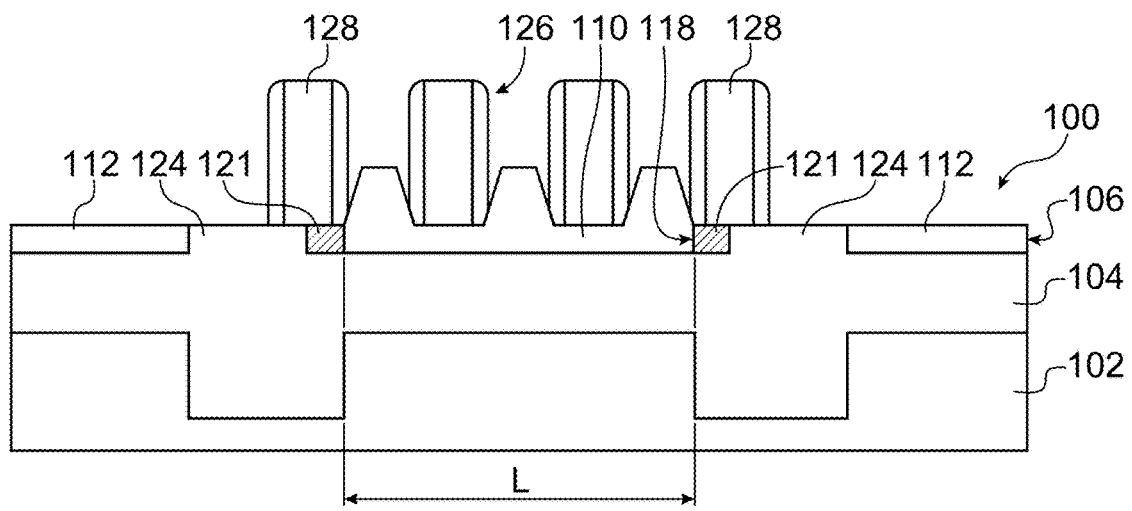
FIG. 19 shows FETs produced in a semiconductor substrate obtained during the implementation of the method for producing the semiconductor substrate.

From the substrate 100 obtained, transistors are produced by implementing the different steps forming these transistors (lithography, etching, production of gates, epitaxy, doping, etc.). P-type FETs 126 are produced in the first region 110 of compressively strained SiGe (see FIG. 19). Advantageously, these FETs produced are of FDSOI, FinFet, nanowire or nanosheet type.

These transistors 126 are advantageously produced with source and drain regions including SiGe with a germanium concentration greater than that in the strained SiGe of the first region 110. Thus, the difference in lattice parameter between the semiconductor (SiGe in the embodiment described here) of these source and drain regions and the strained semiconductor (also SiGe in the embodiment described here) of the first region 110 tends to generate, or to increase as is the case here, a compressive strain in the channels of the transistors 126. In the embodiment described here, an important transfer of the compressive strain from the source and drain regions to the channels of the transistors 126 is obtained thanks to the portions 121 confining the strained SiGe of the region 110.

In a usual configuration, the gates of the transistors located the nearest to the isolation trench 124 are dummy gates not fulfilling any electronic function. Two dummy gates 128 are shown in FIG. 16. The gate is arranged partially on the isolation trenches 124. Moreover, the portions 121 are also located under these dummy gates 128.

In a preferential embodiment, the width of the portions 121, that is to say the dimension belonging to the main plane of the superficial layer 106 and which, on each side of the region 110 of the superficial layer 106, is substantially perpendicular to the lateral walls of the isolation trench 124, is such that the portions 121 do not form part of the channels of the P-type FET 126 which are not dummies. To do so, the width of the portions 121 is for example less than or equal to 0.5 CPP (Contacted Poly Pitch, which corresponds to the inter-gate distance, that is to say the pitch between the gates of two neighbouring transistors). Thus, in the configuration shown in FIG. 19, the portions 121 are not arranged under the gate of an electrically active transistor, that is to say in the channel region of such a transistor (the portions 121 may on the other hand be arranged in a source or drain region of such a transistor).

This method may be implemented such that the regions of semiconductor obtained to produce P-type MOS transistors comprise compressively strained SiGe or unstrained SiGe or unstrained silicon, and/or that the regions of semiconductor obtained to produce N-type MOS transistors comprise tensile strained SiGe or unstrained SiGe or unstrained silicon.

The invention claimed is:

1. A method for producing a semiconductor substrate, comprising the following steps:
producing a superficial layer arranged on a buried dielectric layer and including a strained semiconductor region, the buried dielectric layer being disposed on a support layer;
producing an etching mask on the superficial layer, covering at least one part of the strained semiconductor region;
etching the superficial layer, buried dielectric layer and support layer according to a pattern of the etching mask, exposing a first lateral edge of the strained semiconductor region;
transforming a portion of the strained semiconductor region, the portion being defined by the first lateral edge on one side and extending into the strained semiconductor region, into a different material, the transformed portion contacting a remaining portion of the strained semiconductor region and having a bottom surface in contact with the buried dielectric layer and an upper surface in contact with the etching mask; and
removing the etching mask.

2. The method according to claim 1, wherein the transforming comprises implementation of a chemical reaction transforming the portion of the strained semiconductor region.

3. The method according to claim 2, wherein the chemical reaction corresponds to an oxidation and/or a nitridation of the portion of the strained semiconductor region.

4. The method according to claim 2,
wherein the transforming further comprises, prior to the implementation of the chemical reaction, removing a part of the strained semiconductor region, and
wherein the chemical reaction is next implemented from a remainder of the strained semiconductor region.

5. The method according to claim 1, wherein the transforming comprises:
etching of the strained semiconductor region, forming at least one cavity arranged between the buried dielectric layer and the etching mask, and then
producing, in the at least one cavity, the transformed portion.

6. The method according to claim 1, wherein the different material corresponds to at least one semiconductor material and/or one dielectric material.

7. The method according to claim 1,
wherein the strained semiconductor region corresponds to compressively strained SiGe, and
wherein the superficial layer is a germanium enriched silicon layer.

8. The method according to claim 1,
wherein the pattern of the etching mask defines isolation trenches arranged around the strained semiconductor region, and
wherein the method further comprises, after the transforming, depositing at least one dielectric material in the isolation trenches.

9. The method according to claim 1, wherein a dimension of the transformed portion, along a direction substantially perpendicular to the first lateral edge, is between around 3 nm and 25 nm.

10. The method according to claim 1, wherein:
the strained semiconductor region has, in a main plane of the superficial layer, a substantially rectangular shape,
the pattern of the etching mask is such that the etching of the superficial layer exposes two opposite first lateral edges formed by the strained semiconductor region, and
the transforming is implemented such that two portions of the strained semiconductor region that form the two opposite first lateral edges are transformed, the two portions being in contact with the buried dielectric layer.

11. The method according to claim 10, wherein:
the pattern of the etching mask is such that the etching of the superficial layer further exposes two opposite second lateral edges, formed by the strained semiconductor region and being substantially perpendicular to the two opposite first lateral edges, and
the transforming is implemented such that four portions of the strained semiconductor region that form the two opposite first lateral edges and the two opposite second lateral edges are transformed, the four portions being in contact with the buried dielectric layer.

12. The method according to claim 1, wherein the etching mask comprises at least one tensile or compressively strained material.

13. The method according to claim 1, further comprising, after the removing of the etching mask:
thinning of the strained semiconductor region; and
epitaxy of at least one second semiconductor on the thinned strained semiconductor region.

14. A method for producing at least one field effect transistor (FET), wherein the at least one FET is produced in the strained semiconductor region of the semiconductor substrate obtained by implementation of the method according to claim 1.

15. The method according to claim 14, wherein the method further comprises producing at least one dummy gate is formed on the transformed portion of the strained semiconductor region.

16. The method according to claim 1, wherein the first lateral edge is oriented substantially perpendicular to main faces of the strained semiconductor region, the main faces extending along respective interfaces of the buried dielectric layer and the strained semiconductor region, and of the strained semiconductor region and the etching mask.

17. The method according to claim 1, wherein the transformed portion reduces relaxation in the remaining portion of the strained semiconductor region during the removing of the etching mask.

18. The method according to claim 1, wherein the transformed portion is chemically modified relative to the remaining portion of the strained semiconductor region.

19. The method according to claim 1, wherein:
the etching produces a first planar portion of the strained semiconductor region; and
the transforming produces a second planar portion of the strained semiconductor region having at least one peripheral edge in direct contact with the transformed portion.

20. The method according to claim 1, wherein:
the etching produces a first planar portion of the strained semiconductor region; and
the transforming produces a second planar portion of the strained semiconductor region having a periphery surrounded by and in direct contact with the transformed portion.

* * * * *